United States Patent
Tian

(10) Patent No.: US 9,524,852 B2
(45) Date of Patent: Dec. 20, 2016

(54) METHOD FOR MONITORING ION IMPLANTATION

(71) Applicant: BOE TECHNOLOGY GROUP CO., LTD., Beijing (CN)

(72) Inventor: Hui Tian, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/437,046

(22) PCT Filed: Dec. 5, 2014

(86) PCT No.: PCT/CN2014/093144
§ 371 (c)(1),
(2) Date: Apr. 20, 2015

(87) PCT Pub. No.: WO2015/196742
PCT Pub. Date: Dec. 30, 2015

(65) Prior Publication Data
US 2016/0071691 A1    Mar. 10, 2016

(30) Foreign Application Priority Data

Jun. 25, 2014 (CN) .......................... 2014 1 0289586

(51) Int. Cl.
*H01L 21/66* (2006.01)
*H01J 37/30* (2006.01)
*H01J 37/317* (2006.01)

(52) U.S. Cl.
CPC ........ *H01J 37/3005* (2013.01); *H01J 37/3171* (2013.01); *H01J 2237/2445* (2013.01)

(58) Field of Classification Search
CPC ................ H01J 37/3005; H01J 37/3171; H01J 2237/2445
See application file for complete search history.

(56) References Cited

U.S. PATENT DOCUMENTS 3,803,705 A * 4/1974 Goodwin .............. H01L 29/792
  257/E29.309
4,567,132 A * 1/1986 Fredericks .......... H01L 21/0272
  257/E21.025

(Continued)

FOREIGN PATENT DOCUMENTS

CN          1412820 A      4/2003
CN        101329989 A     12/2008

(Continued)

OTHER PUBLICATIONS

Lu et al. SiO2 film thickness metrology by x-ray photoelectron spectroscopy, Applied Physics Letters vol. 71, No. 19 (Nov. 1997), pp. 2764-2766.*

(Continued)

*Primary Examiner* — David Porta
*Assistant Examiner* — Shun Lee
(74) *Attorney, Agent, or Firm* — Collard & Roe, P.C.

(57) ABSTRACT

A method for monitoring ion implantation, comprising: a), providing a control piece and forming a mask layer; b), performing ion implantation process to implant a predetermined dose of impurity ions into the control piece, an area on the control piece uncovered by the mask layer being an impurity implantation area and an area on the control piece covered by the mask layer being an impurity non-implantation area; c), peeling off the mask layer from the control piece; d), performing oxidation treatment on the control piece; and e), respectively measuring thicknesses of the oxide layers on the impurity implantation area and the impurity non-implantation area of the control piece, and monitoring the impurity dose of the ion implantation on the basis of a ratio of the thickness of the oxide layer in the impurity implantation area to the thickness of the oxide layer in the impurity non-implantation area. By this method, it is possible to accurately monitor whether or not the dose of the (Continued)

implanted ions meets the predetermined requirement, and it is possible to effectively avoid the defects of incorrect monitor result caused by the variation of the intrinsic resistance of the semiconductor, improve the accuracy of the monitoring, and thus improve the performance and yield rate of the device.

20 Claims, 1 Drawing Sheet

(56) References Cited

U.S. PATENT DOCUMENTS

| | | | | |
|---|---|---|---|---|
| 4,920,397 | A | * | 4/1990 | Ishijima ............ H01L 21/82387 257/334 |
| 5,706,094 | A | * | 1/1998 | Maris ................. G01N 21/1717 356/432 |

FOREIGN PATENT DOCUMENTS

| | | |
|---|---|---|
| CN | 102130032 A | 7/2011 |
| CN | 103500718 A | 1/2014 |
| CN | 104091767 A | 10/2014 |

OTHER PUBLICATIONS

International Search Report of the International Searching Authority for PCT/CN2014/093144 with Notice of Transmittal of the International Search Report mailed Feb. 15, 2015 in Chinese.

English Translation of the Written Opinion of the International Searching Authority of PCT/CN2014/093144 mailed Feb. 15, 2015 in Chinese with an English translation.

Chinese Office Action in Chinese Application No. 201410289586.8, mailed Apr. 29, 2016 with English translation.

* cited by examiner

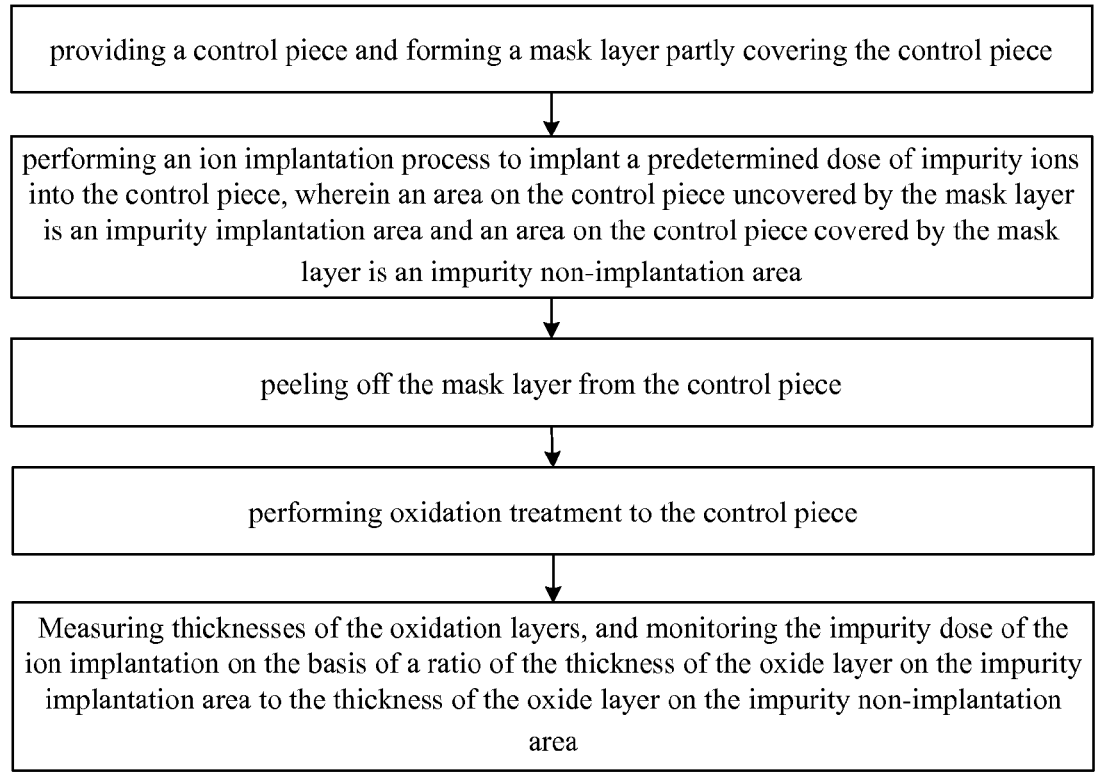

METHOD FOR MONITORING ION IMPLANTATION

CROSS REFERENCE TO RELATED APPLICATIONS

This application is the National Stage of PCT/CN2014/093144 filed on Dec. 5, 2014, which claims priority under 35 U.S.C. §119 of Chinese Application No. 201410289586.8 filed on Jun. 25, 2014 the disclosure of which is incorporated by reference.

TECHNICAL FIELD

Embodiments of the present invention relates to a method for monitoring ion implantation.

BACKGROUND

Ion implantation is a technology for doping, wherein a surface of a silicon wafer is bombarded with high-energy ions, and impurity ions go into a silicon body at a doping window, and the other area of the surface of the silicon wafer is masked by a protection layer, thus locally selective doping is accomplished. The ion implantation is a key process step in semiconductor processes, and in the display field and the semiconductor manufacturing field, various semiconductor doping areas can be formed on the semiconductor substrate through ion implantation, this is the basis for forming various device structures.

In ion implantation processes, in order to guarantee the substrate to have the predetermined electrical performances after implanting impurities, there is restrict requirement on a concentration and a depth of the implanted impurities, thus, it is necessary to monitor the ion implantation process in real time. An existing method for monitoring the ion implantation process is as follows: after the ion implantation is completed, a piece to be monitored is firstly annealed accordingly to activate the implanted impurities, then its resistance is measured by a four-probe method, and finally, it is determined whether or not the concentration of the implanted impurities meets the requirement according to the resistance. However, in such a monitoring method, as an intrinsic resistance of the silicon wafer substrate is greatly varied, the final calculation result will be affected greatly thereby, and at the same implantation condition and at the same annealing condition, there will be a great difference between the final test results for silicon wafer substrates with different intrinsic resistances, it is impossible to accurately monitor the resistance of a substrate after ion implantation, and the monitoring result has a poor accuracy.

SUMMARY

Embodiments of the present disclosure provide a method for monitoring ion implantation, which is capable of accurately monitoring whether or not a dose of the implanted ion meets a predetermined requirement, and effectively avoids the defects that incorrect monitor result will be caused by the variation of the intrinsic resistance of the substrate in conventional arts, increases the accuracy of the monitoring. And thus, the performances of the device are improved and the yield rate is increased.

At least one embodiment of the present disclosure provides a method for monitoring ion implantation, comprising:
providing a control piece and forming a mask layer partly covering the control piece on the control piece;
performing an ion implantation process to implant a predetermined dose of impurities ions into the control piece, wherein an area on the control piece uncovered by the mask layer is an impurity implantation area and an area on the control piece covered by the mask layer is an impurity non-implantation area;
peeling off the mask layer from the control piece;
performing oxidation treatment on the control piece; and
respectively measuring thicknesses of the oxide layers in the impurity implantation area and in the impurity non-implantation area of the control piece, and control the impurity dose of the ion implantation on the basis of a ratio of the thickness of the oxide layer on the impurity implantation area to the thickness of the oxide layer on the impurity non-implantation area.

In one embodiment of the present disclosure, performing oxidation treatment on the control piece comprises performing oxidation treatment on the control piece in a high-temperature annealing oven.

In one embodiment of the present disclosure, during performing oxidation treatment on the control piece, a temperature for the oxidation treatment is 800° C. to 1000° C., a time period of the oxidation treatment is 1 to 2 h, and a flow rate of the oxygen is 400 ml/min to 500 ml/min.

In an embodiment of the present disclosure, the thicknesses of the oxide layers on the impurity implantation area and on the impurity non-implantation area are measured by a variable angle X-ray Photoelectron Spectroscopy method.

In an embodiment of the present disclosure, the impurity ion for the ion implantation is B+, or P+, or As+.

In an embodiment of the present disclosure, the mask layer is a photoresist layer, the mask layer is formed by coating photoresist on the control piece and then performing photolithography on the photoresist on the control piece.

In an embodiment of the present disclosure, on the control piece, the ratio of the area covered by the mask layer to the area uncovered by the mask layer is 1:1.

Embodiments of the present disclosure provide a method for monitoring ion implantation, wherein, by providing a control piece, partly covering the control piece by a mask layer, then performing synchronous control in the ion implantation process (or performing advance control by employing parameters as same as those of the ion implantation process to be monitored), a predetermined dose of impurity ions are implanted into the control piece. Then the mask layer is removed and oxidation treatment is performed on the control piece. Since various doses of implanted ions will enhance oxidation in different degrees, by measuring ratio of the thicknesses of the oxidation layers on the ion implantation area and the ion non-implantation area, it is possibly to accurately monitor whether or not the dose of the implanted ions meets the predetermined requirement, and it is possible to effectively avoid the defect that incorrect monitoring result will occur due to variation of the intrinsic resistance of the semiconductor in conventional arts known by the present inventor, and to improve the accuracy of the monitoring. Thus, performances and yield rate of the device are improved.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

FIG. 1 is a flowchart diagram illustrating a method for monitoring ion implantation process according to the embodiments of the present disclosure, wherein a resistance of a polysilicon thin film on a polysilicon array substrate.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Embodiments of the present disclosure provide a method for monitoring ion implantation, by which it is possible to accurately monitor whether or not dose of the implanted ion meets a predetermined requirement, and it is possible to effectively avoid the defect that incorrect monitor result will occur due to variations of the intrinsic resistance of the substrate in conventional arts known by the present inventor, and to improve the accuracy of the monitoring. Thus, performances and yield rate of the device are improved.

As illustrated in FIG. 1, a method for monitoring ion implantation according to one embodiments of the present disclosure comprises:

providing a control piece and forming a mask layer partly covering the control piece on the control piece;

Concentration and depth of the implanted impurities during the ion implantation process are influenced by three factors, namely, the matrix film layer, the impurity ion to be implanted, and the parameters for ion implantation, the parameters for ion implantation mainly comprises an implantation dose and an implantation energy. Therefore, the control pieces is provided with the same matrix film layer as the matrix film layer present in the product to be monitored upon implantation, generally, the matrix film layer is semiconductor material.

In the present embodiment, the amount of the control pieces can be set as necessary, and there is no limitation set forth thereon. In addition, since material of the substrate will influence on component, structure and quality (e.g. compactness) of the film layer thereon, in an embodiment of the present disclosure, not only the same matrix film layer, but also the same substrate are used to form the control piece to form the matrix film layer.

It is required that the mask layer as described in the present embodiment serves as a barrier layer for the ion implantation during the ion implantation process, thus the material and thickness of the mask layer are determined according to the requirement. In an alternative embodiment, photoresist is selected to form the mask layer. During forming the mask layer partly covering the control piece, by coating photoresist on the control piece and then performing photolithography, a patterned mask layer is formed as an ion implantation window. The pattern of the mask layer is not limited, as long as the mask layer can expose a part of the control piece. For the sake of simplifying calculation, ratio of the area covered by the mask layer to the area uncovered by the mask layer usually is 1:1.

Ion implantation process is performed to implant a predetermined dose of impurity ions into the control piece. Area on the control piece uncovered by the mask layer is an impurity implantation area, and area on the control piece covered by the mask layer is an impurity non-implantation area.

The parameters used in ion implantation mainly comprise implantation dose and implantation energy, but as well known to the person skilled in the art, the parameters to be mainly monitored is the implantation dose used in ion implantation.

When the ion implantation process is performed, ion implantation can be performed simultaneously on the control piece and the product to be monitored, or alternatively, a pre-monitoring can be performed by using the same parameters as that used when the ion implantation is performed on the product to be monitored. Optionally, the impurity ions to be implanted is usually B+, or P+ or As+, and the type of the impurity ion can be a n-type or a p-type.

After that, peeling off the mask layer from the control piece. The method for forming and peeling off the mask layer depends on the material, and will not be further described in detail.

Next, performing oxidation treatment to the control piece;

There is no limitation on a manner how the oxidation treatment is performed in the step, and any well-known method in the art can be used. An optional oxidation treatment is as follows: the control piece is subject to an oxidation treatment in a high-temperature annealing oven under the following condition: for example, a temperature for the oxidation treatment is 800 to 1000° C., e.g. 950° C.; a time period for the oxidation treatment is 1 to 2 h, e.g. 1 h; a flow rate of the oxygen is 400 ml/min to 500 ml/min, e.g. 450 ml/min.

Respectively measuring thicknesses of the oxide layers on the impurity implantation area and the impurity non-implantation area on the control piece, and monitoring the impurity dose of the ion implantation according to a ratio of the thicknesses of the oxide layers respectively on the impurity implantation area and the impurity non-implantation area.

Since the ion implantations with different doses will generate different degrees of the oxidation enhancement effects, and the oxidation enhancement effect is generated by the high-energy bombardment of the ion itself, independent from the used substrate, the thickness of the oxide layer is related to the depth and the dose of the implanted ions, and moreover, the ratio of the thickness of the oxide layer in the ion implantation area to the thickness of the oxide layer in the ion non-implantation area is linearly dependent on the implantation dose of the implanted ions. Accordingly, in the present solution, by measuring the thickness of the oxide layer in the ion implantation area and the thickness of the oxide layer in the ion non-implantation area, and calculating the ratio of the thickness, the affect by the substrate is removed, and thus it is possible to accurately determine whether or not the dose of the implanted ions has met a predetermined requirement, thereby the defects of incorrect monitor result due to the variation of the intrinsic resistance of the semiconductor in the prior art as known by the present inventor can be effectively avoided. Thus, accuracy of the monitoring can be enhanced, and performance and yield rate of the device can be improved.

In one embodiment according to the present disclosure, the thickness of the oxide layers respectively in the ion implantation area and in the ion non-implantation area can be measured by a variable angle X-ray Photoelectron Spectroscopy method (angle dependent XPS), but it is not limited thereto.

In one embodiment according to the present disclosure, the conditions provided for the ion implantation are as follows: the energy for the ion implantation is 85 key, the implantation dose for the ion implantation is $5E15/cm^2$, the temperature for the oxidation treatment is 950° C., the time period is about 1 hour, and the ratio of the thicknesses of the oxide layers in the ion implantation area and in the ion non-implantation area is 1.06. By comparing the calculated ratio of the thicknesses of the oxide layer with the ratio of the thicknesses of the oxide layers corresponding to the implantation dose as listed in Table 1, it can be determined whether or not the dose of the implanted ion meets the predetermined requirement. For example, as listed in Table 1, corresponding to the implantation does of $5E15/cm^2$, if the ratio of the thicknesses of the oxide layers is in a range of 1.059 to 1.061, it meets the production requirement. And in the present embodiment, the measured ratio of the thicknesses of the oxide layer is 1.06, falling in the range of 1.059 to 1.061, therefore, the dose of the implanted ions meets the predetermined requirement. The correlation relationship between the dose of the implanted ions and the thickness of the oxide layer is shown in the below table, the table can be obtained by experiments in advance, and mainly by preparing samples and testing the samples in advance.

TABLE 1 the correlation relationship between the ratio of the thicknesses of the oxide layers and the dose of the implanted ions

|  | Ratio of the thickness of the oxide layers | | |
| --- | --- | --- | --- |
|  | 1.027~1.029 | 1.033~1.035 | 1.059~1.061 |
| Implantation dose | $1.00E14/cm^2$ | $1.00E15/cm^2$ | $5.00E15/cm^2$ |

Embodiments of the present disclosure provide a method for monitoring ion implantation, in this method, by providing a control piece, partly covering the control piece by a mask layer, then performing synchronous monitoring during the ion implantation process (or performing pre-monitoring by employing the same parameters as the ion implantation process to be monitored), a predetermined dose of impurity ions are implanted into the control piece. Since different dose of implanted ions will generate oxidation enhancement effect in different degree, by measuring the ratio of the thicknesses of the oxidation layers respectively on the ion implantation area and the ion non-implantation area, it is possibly to accurately monitor whether or not the dose of the implanted ions meets the predetermined requirement, and it is possible to effectively avoid the defects of incorrect monitor result caused by the variation of the intrinsic resistance of the semiconductor in conventional arts known to the present inventor, improve the accuracy of the monitoring, and thus improve the performance and yield rate of the device.

It is noted that the technical features in the embodiments of the present disclosure can be used in combination, unless confliction to each other.

The foregoing are merely exemplary embodiments of the invention, but are not used to limit the protection scope of the invention. The protection scope of the invention shall be defined by the attached claims.

The present application claims the priority of Chinese Patent Application No. 201410289586.8 filed on Jun. 25, 2014, the disclosure of which is hereby entirely incorporated by reference.

The invention claimed is:

1. A method for monitoring ion implantation, comprising:
providing a control piece and forming a mask layer partly covering the control piece on the control piece;
performing ion implantation process to implant a predetermined dose of impurity ions into the control piece, wherein an area on the control piece uncovered by the mask layer is an impurity implantation area and an area on the control piece covered by the mask layer is an impurity non-implantation area;
peeling off the mask layer from the control piece;
performing oxidation treatment to the control piece; and
respectively measuring the thickness of the oxide layers in the impurity implantation area and the impurity non-implantation area of the control piece, and monitoring the impurity dose of the ion implantation on the basis of a ratio of the thickness of the oxide layer on the impurity implantation area to the thickness of the oxide layer on the impurity non-implantation area.

2. The method according to claim 1, wherein, the oxidation treatment to the control piece is performed in a high-temperature annealing oven.

3. The method according to claim 2, wherein the temperature for the oxidation treatment is 800° C. to 1000° C.

4. The method according to claim 2, wherein time period for the oxidation treatment is 1 h to 2 h.

5. The method according to claim 2, wherein the flow rate of the oxygen used in the oxidation treatment is 400 ml/min to 500 ml/min.

6. The method according to claim 2, wherein the thicknesses of the oxide layers respectively on the impurity implantation area and on the impurity non-implantation area is measured by a variable angle X-ray Photoelectron Spectroscopy method.

7. The method according to claim 2, wherein:
the impurity ion for ion implantation is B+, or P+, or As+.

8. The method according to claim 1, wherein the temperature for the oxidation treatment is 800° C. to 1000° C.

9. The method according to claim 8, wherein time period for the oxidation treatment is 1 h to 2 h.

10. The method according to claim 8, wherein the flow rate of the oxygen used in the oxidation treatment is 400 ml/min to 500 ml/min.

11. The method according to claim 8, wherein the thicknesses of the oxide layers respectively on the impurity implantation area and on the impurity non-implantation area is measured by a variable angle X-ray Photoelectron Spectroscopy method.

12. The method according to claim 1, wherein time period for the oxidation treatment is 1 h to 2 h.

13. The method according to claim 12, wherein the flow rate of the oxygen used in the oxidation treatment is 400 ml/min to 500 ml/min.

14. The method according to claim 12, wherein the thicknesses of the oxide layers respectively on the impurity implantation area and on the impurity non-implantation area is measured by a variable angle X-ray Photoelectron Spectroscopy method.

15. The method according to claim 1, wherein the flow rate of the oxygen used in the oxidation treatment is 400 ml/min to 500 ml/min.

16. The method according to claim 15, wherein the thicknesses of the oxide layers respectively on the impurity implantation area and on the impurity non-implantation area is measured by a variable angle X-ray Photoelectron Spectroscopy method.

17. The method according to claim 1, wherein the thicknesses of the oxide layers respectively on the impurity implantation area and on the impurity non-implantation area is measured by a variable angle X-ray Photoelectron Spectroscopy method.

18. The method according to claim 1, wherein:
the impurity ion for ion implantation is B+, or P+, or As+.

19. The method according to claim 1, wherein the mask layer is a photoresist layer, and the mask layer is formed by coating the photoresist on the control piece and then performing photolithography on the photoresist.

20. The method according to claim 1, wherein the ratio of the area covered by the mask layer to the area uncovered by the mask layer on the control piece is 1:1.

* * * * *